US008677056B2

(12) United States Patent
Yen (10) Patent No.: US 8,677,056 B2
(45) Date of Patent: Mar. 18, 2014

(54) METHODS AND APPARATUS FOR INTERFACING BETWEEN A FLASH MEMORY CONTROLLER AND A FLASH MEMORY ARRAY

(75) Inventor: Johnson Yen, Fremont, CA (US)

(73) Assignee: LSI Corporation, San Jose, CA (US)

(*) Notice: Subject to any disclaimer, the term of this patent is extended or adjusted under 35 U.S.C. 154(b) by 316 days.

(21) Appl. No.: 13/001,300

(22) PCT Filed: Jun. 30, 2009

(86) PCT No.: PCT/US2009/049328
§ 371 (c)(1),
(2), (4) Date: Feb. 25, 2011

(87) PCT Pub. No.: WO2010/002943
PCT Pub. Date: Jan. 7, 2010

(65) Prior Publication Data
US 2011/0138114 A1 Jun. 9, 2011

Related U.S. Application Data

(60) Provisional application No. 61/133,921, filed on Jul. 7, 2008, provisional application No. 61/134,688, filed on Jul. 10, 2008, provisional application No. 61/133,675, filed on Jul. 1, 2008.

(51) Int. Cl.
*G06F 13/00* (2006.01)
(52) U.S. Cl.
USPC ............... 711/103; 365/185.33; 711/E12.103
(58) Field of Classification Search
USPC .................................................. 365/233.13
See application file for complete search history.

(56) References Cited

U.S. PATENT DOCUMENTS

| 6,467,044 | B1 | 10/2002 | Lackey |
| 6,845,057 | B2* | 1/2005 | Widmer et al. .......... 365/230.03 |
| 2004/0057284 | A1 | 3/2004 | Widmer et al. |
| 2007/0180219 | A1 | 8/2007 | Lino et al. |
| 2007/0189073 | A1 | 8/2007 | Aritome |
| 2008/0019188 | A1 | 1/2008 | Li |

FOREIGN PATENT DOCUMENTS

| JP | H03142800 | 6/1991 |
| WO | WO 2007127678 | 11/2007 |

OTHER PUBLICATIONS

Lee, Jae-Duk, 'Effects of Floating-Gate Interference on NAND Flash Memory Cell Operation'. IEE Electron Device Letters, vol. 23, No. 5 p. 264-266 May 2002.*

* cited by examiner

*Primary Examiner* — Edward Dudek, Jr.
*Assistant Examiner* — Sean D Rossiter
(74) *Attorney, Agent, or Firm* — Ryan, Mason & Lewis, LLP (57) ABSTRACT

Methods and apparatus are provided for interfacing between a flash memory controller and a flash memory array. The interface comprises a communication channel between the flash memory controller and the flash memory array, wherein the communication channel carries data for a target cell in the flash memory array on a first edge of a clock signal and wherein the communication channel carries additional information for the target cell on a second edge of the clock signal. For an exemplary write access, the additional information comprises, for example, information about one or more aggressor cells associated with the target cell. For an exemplary read access, the additional information comprises, for example, soft information for the data for the target cell transmitted on the first edge.

15 Claims, 10 Drawing Sheets

METHODS AND APPARATUS FOR INTERFACING BETWEEN A FLASH MEMORY CONTROLLER AND A FLASH MEMORY ARRAY

CROSS-REFERENCE TO RELATED APPLICATIONS

The present application claims priority to U.S. Provisional Patent Application Ser. No. 61/133,675, filed Jul. 1, 2008; U.S. Provisional Patent Application Ser. No. 61/133,921, filed Jul. 3, 2008; and U.S. Provisional Patent Application Ser. No. 61/134,688, filed Jul. 10, 2008, each incorporated by reference herein.

The present application is related to International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," and International Patent Application entitled "Methods and Apparatus for Read-Side Intercell Interference Mitigation in Flash Memories;" International Patent Application entitled "Methods and Apparatus for Write-Side Intercell Interference Mitigation in Flash Memories;" International Patent Application entitled "Methods and Apparatus for Intercell Interference Mitigation Using Modulation Coding;" and International Patent Application entitled "Methods and Apparatus for Soft Demapping and Intercell Interference Mitigation in Flash Memories," each filed contemporaneously herewith and incorporated by reference herein.

FIELD OF THE INVENTION

The present invention relates generally to flash memory devices and more particularly, to techniques for interfacing between the controller and memory array in such flash memory devices.

BACKGROUND OF THE INVENTION

A number of memory devices, such as flash memory devices, use analog memory cells to store data. Each memory cell stores an analog value, also referred to as a storage value. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). In a multi-level cell device, at least three threshold levels are employed to define four or more different threshold states. The operating range of an individual cell is thus divided into an increased number of states and the range of each state is smaller than for a single-level cell device. Thus, the reliability of any single bit in a multi-level cell device is generally lower than the reliability of a single-level cell device.

For a more detailed discussion of multi-level codes, see, for example, U. Wachsmann et al., "Multilevel Codes: Theoretical Concepts and Practical Design Rules," IEEE Trans. on Information Theory, Vol. 45, No. 5, 1361-91 (1999), incorporated by reference herein.

A flash memory typically comprises a flash memory array, flash controller and an interface for communications between the flash memory array and the flash controller. The Open NAND Flash Interface Working Group (ONFI) is an industry consortium developing open standards for NAND flash memory devices and devices that communicate with them. ONFI has produced a specification for a standard interface to NAND flash chips. ONFI Version 2.0 uses Double Data Rate (DDR) techniques to transfer data on both the rising and falling edges of the clock signal. While ONFI Version 2.0 has increased the data-carrying capacity of the NAND flash interface, it does not provide additional bandwidth for carrying additional information that may improve performance.

A need therefore exists for an improved interface between the controller and the memory array in a flash memory device. Yet another need exists for an improved interface between the controller and the memory array in a flash memory device that provides additional bandwidth for additional information about the transmitted data. A further need exists for an improved interface between the controller and the memory array in a flash memory device that provides additional bandwidth without significantly increasing power dissipation or surface area.

SUMMARY OF THE INVENTION

Generally, methods and apparatus are provided for interfacing between a flash memory controller and a flash memory array. According to one aspect of the invention, an interface is provided for use between a flash memory controller and a flash memory array. The interface comprises a communication channel between the flash memory controller and the flash memory array, wherein the communication channel carries data for a target cell in the flash memory array on a first edge of a clock signal and wherein the communication channel carries additional information for the target cell on a second edge of the clock signal.

For an exemplary write access, the additional information comprises, for example, information about one or more aggressor cells associated with the target cell. For example, the information about the one or more aggressor cells can comprise one or more bits of program data for the one or more aggressor cells. For an exemplary read access, the additional information comprises, for example, soft information for the data for the target cell transmitted on the first edge.

A more complete understanding of the present invention, as well as further features and advantages of the present invention, will be obtained by reference to the following detailed description and drawings.

DETAILED DESCRIPTION

The present invention provides an improved interface between the flash memory controller and the flash memory array. The disclosed interface provides additional bandwidth for additional information about the transmitted data, without significantly increasing power dissipation or surface area. While the invention is illustrated in the context of ICI mitigation, where the additional transmitted information comprises, for example, soft information about the transmitted data or values of one or more adjacent cells related to the transmitted target cell data, the present invention can be applied to transfer additional information for other applications as well, as would be apparent to a person of ordinary skill in the art. According to one aspect of the invention, data is transferred on a first edge of a clock signal (such as a rising edge), and additional information about the transferred data is transmitted on a second edge of the clock signal (such as a falling edge).

Various aspects of the present invention are directed to signal processing techniques for mitigating ICI in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages or currents to represent stored data, as would be apparent to a person of ordinary skill in the art.

Figure 1:
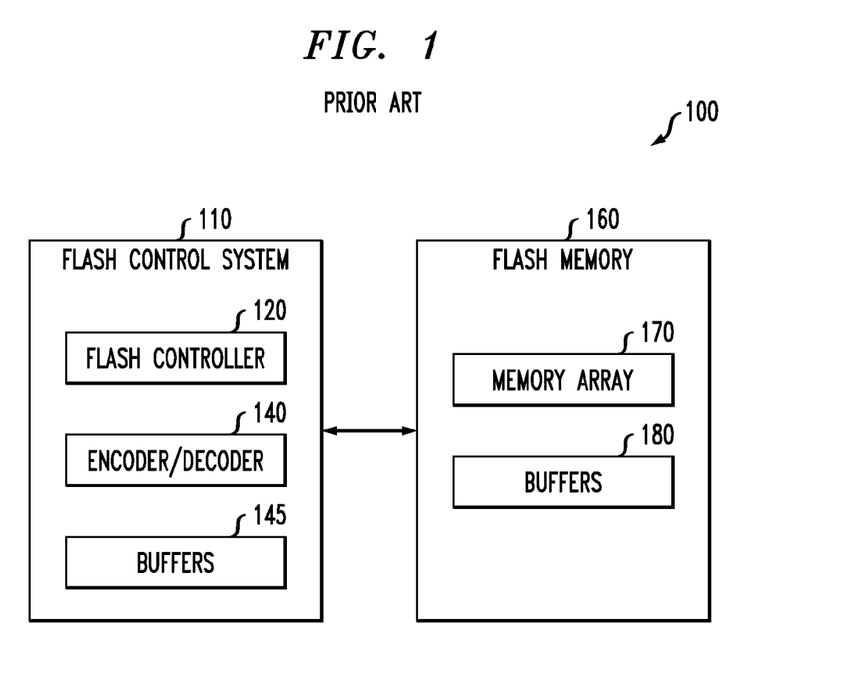
FIG. 1 is a schematic block diagram of a conventional flash memory system.

FIG. 1 is a schematic block diagram of a conventional flash memory system 100. As shown in FIG. 1, the exemplary flash memory system 100 comprises a flash control system 110 and a flash memory block 160. The exemplary flash control system 110 comprises a flash controller 120, an encoder/decoder block 140 and one or more buffers 145. In an alternative embodiment, the encoder/decoder block 140 and some buffers 145 may be implemented inside the flash controller 120. The encoder/decoder block 140 and buffers 145 may be implemented, for example, using well-known commercially available techniques and/or products.

The exemplary flash memory block 160 comprises a memory array 170 and one or more buffers 180 that may each be implemented using well-known commercially available techniques and/or products. The memory array 170 may be embodied as a single-level or multi-level cell flash memory, such as a NAND flash memory, a phase-change memory (PCM), an MRAM memory, a NOR flash memory or another non-volatile flash memory. While the invention is illustrated primarily in the context of a multi-level cell NAND flash memory, the present invention can be applied to single-level cell flash memories and other non-volatile memories as well, as would be apparent to a person of ordinary skill in the art.

Multi-Level Cell Flash Memory

Figure 2:
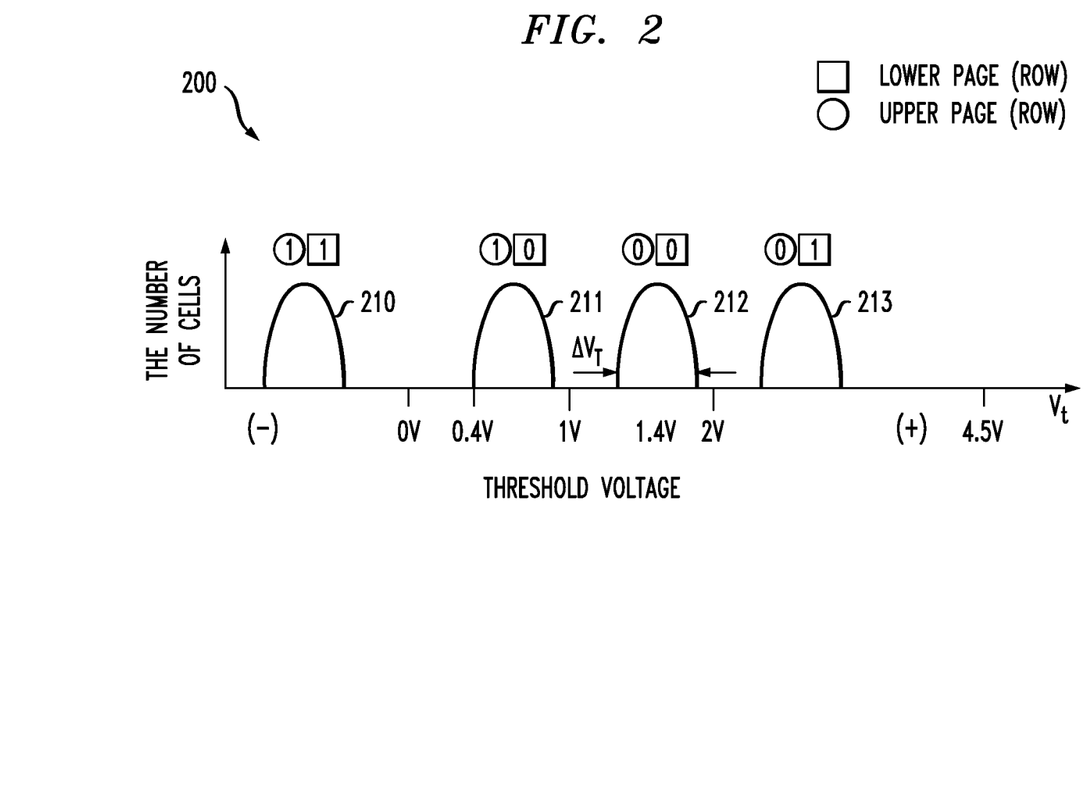
FIG. 2 illustrates an exemplary threshold voltage distribution for the exemplary multi-level cell flash memory of FIG. 1.

In a multi-level cell NAND flash memory, a threshold detector is typically employed to translate the voltage value associated with a particular cell to a predefined memory state. FIG. 2 illustrates an exemplary threshold voltage distribution for the exemplary multi-level cell flash memory 170 of FIG. 1, based on the teachings of U.S. Pat. No. 6,522,580, incorporated by reference herein. Generally, the threshold voltage of a cell is the voltage that needs to be applied to the cell so that the cell conducts a certain amount of current. The threshold voltage is a measure for the data stored in a cell.

In the exemplary embodiment shown in FIG. 2, each storage element employs four possible data states to store two bits of data in each memory cell. FIG. 2 illustrates four peaks 210-213, with each peak corresponding to one state. In a multi-level cell flash device, the different peaks 210-213 of the threshold voltage distribution graph 200 are used for storing two bits in the cell.

The peaks 210-213 of the threshold voltage distribution graph 200 are labeled with corresponding binary values. Thus, when a cell is in a first state 210, it represents a "1" for the lower bit (also known as least significant bit, LSB) and a "1" for the upper bit (also known as most significant bit, MSB). State 210 is generally the initial unprogrammed or erased state of the cell. Likewise, when a cell is in the second state 211, it represents a "0" for the lower bit and a "1" for the upper bit. When a cell is in the third state 212, it represents a "0" for the lower bit and a "0" for the upper bit. Finally, when a cell is in the fourth state 213, it represents a "1" for the lower bit and a "0" for the upper bit.

Threshold voltage distribution 210 represents a distribution of the threshold voltages $V_t$ of the cells within the array that are in an erased state ("11" data state), with negative threshold voltage levels below 0 volts. Threshold voltage distributions 211 and 212 of memory cells storing "10" and "00" user data, respectively, are shown to be between 0 and 1 volts and between 1 and 2 volts, respectively. Threshold voltage distribution 213 shows the distribution of cells that have been programmed to the "01" data state, with a threshold voltage level set between 2 and 4.5 volts of the read pass voltage.

Thus, in the exemplary embodiment of FIG. 2, 0 volts, 1 volt and 2 volts can be used as voltage level thresholds between each level or state. The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell.

It is further noted that cells are typically programmed using well-known Program/Verify techniques. Generally, during a Program/Verify cycle, the flash memory 160 gradually applies an increasing voltage to store a charge in the cell transistor until a minimum target threshold voltage is exceeded. For example, when programming a '10' data state in the example of FIG. 2, the flash memory 160 may gradually apply an increasing voltage to store a charge in the cell transistor until a minimum target threshold voltage of 0.4V is exceeded.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
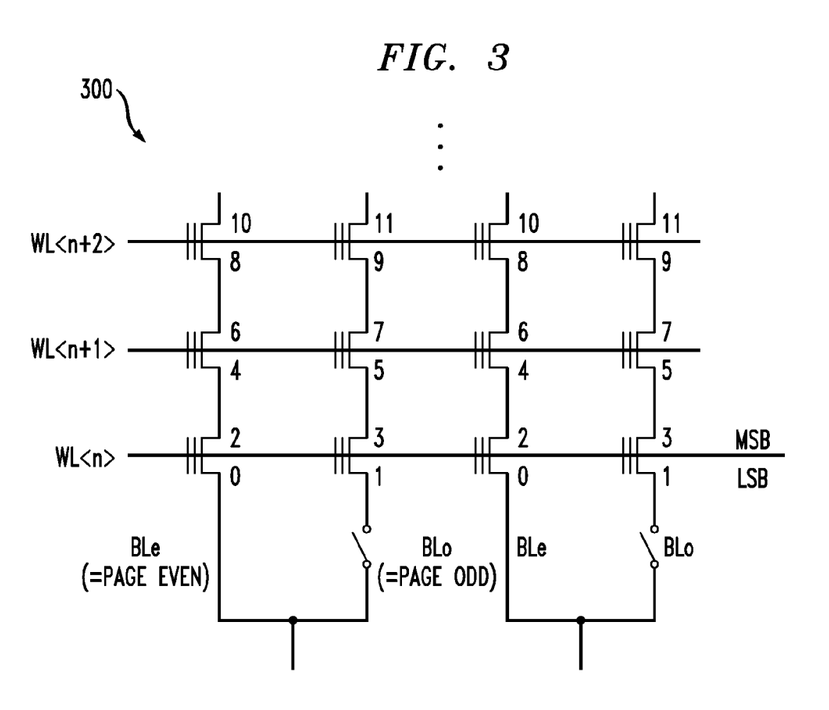
FIG. 3 illustrates the architecture of an exemplary flash cell array in a multi-level cell (MLC) flash memory device.

FIG. 3 illustrates the architecture of an exemplary flash cell array 300 in a multi-level cell (MLC) flash memory device 160, where each exemplary cell typically corresponds to a floating-gate transistor that stores two bits. In FIG. 3 each cell is associated with two numbers for the two pages to which the two bits belong. The exemplary cell array section 300 shows wordlines n through n+2 and four bitlines. The exemplary flash cell array 300 is partitioned into even and odd pages, where for example cells with even numbers (such as the cell with the numbers 0 and 2) correspond to even pages, and cells with odd numbers (such as the cell with the numbers 1 and 3) correspond to odd pages. Wordline n stores for example even pages 0 and 2 in the even bitlines, and odd pages 1 and 3 in the odd bit lines.

In addition, FIG. 3 indicates an exemplary program sequence where either an even or odd bitline cell is selected and programmed sequentially (bottom up) in the indicated order. The numbers indicate the order in which the pages are programmed. For example, page 0 is programmed before page 1. For a further discussion of the programming of even and odd pages, see for example K.-T. Park et al., "A Zeroing Cell-to-Cell Interference Page Architecture with Temporary LBB Storing and Parallel MSB Program Scheme for MLC NAND Flash Memories," IEEE Journal of Solid-State Circuits, Vol. 43, No. 4, 919-928 (April 2008), incorporated by reference herein.

Figure 4:
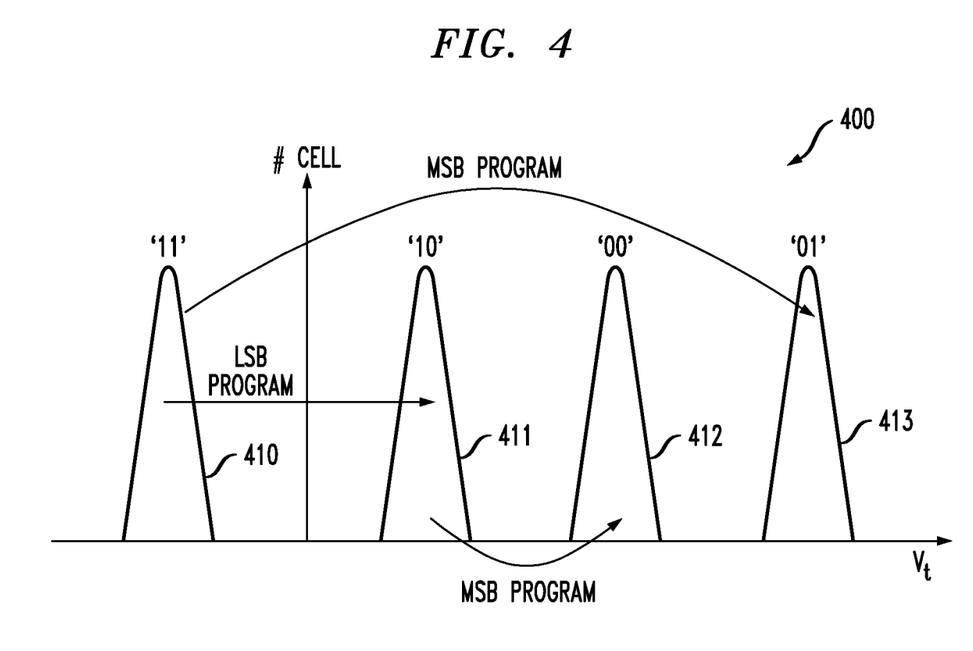
FIG. 4 illustrates an exemplary two-stage MLC programming scheme for the voltage assignment scheme of FIG. 2.

FIG. 4 illustrates an exemplary two-stage MLC programming scheme 400 for the voltage assignment scheme of FIG. 2. As shown in FIG. 4, during an LSB program stage, the states of selected cells that are in an erased state 410 move to the lowest programmed state 411 if the LSB is zero. Thus, at the LSB programming stage, a memory cell is programmed from the erased state '11' to '10'. Next, during the MSB program stage, two states state '00' (412) and state '01' (413) are formed sequentially, depending on the previous LSB data. Generally, during the MSB programming stage, the '10' state is programmed to '00', and the state '11' is programmed to '01'.

It is noted that the programming scheme 400 of FIG. 4 illustrates a maximum voltage shift associated with the change in state from state 410 to state 413. A number of programming schemes have been proposed or suggested to reduce the maximum voltage shift associated with a change in state, and thereby reduce the ICI caused by voltage shifts.

Figure 5A:
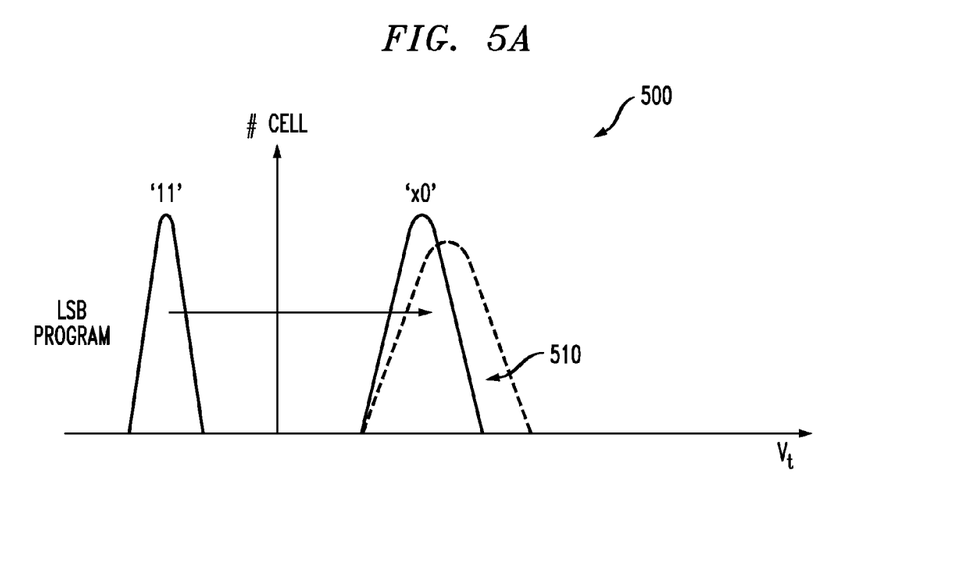
FIGS. 5A and 5B, collectively, illustrate an alternative MLC programming scheme that reduces the ICI inflicted on neighboring cells.
Figure 5B:
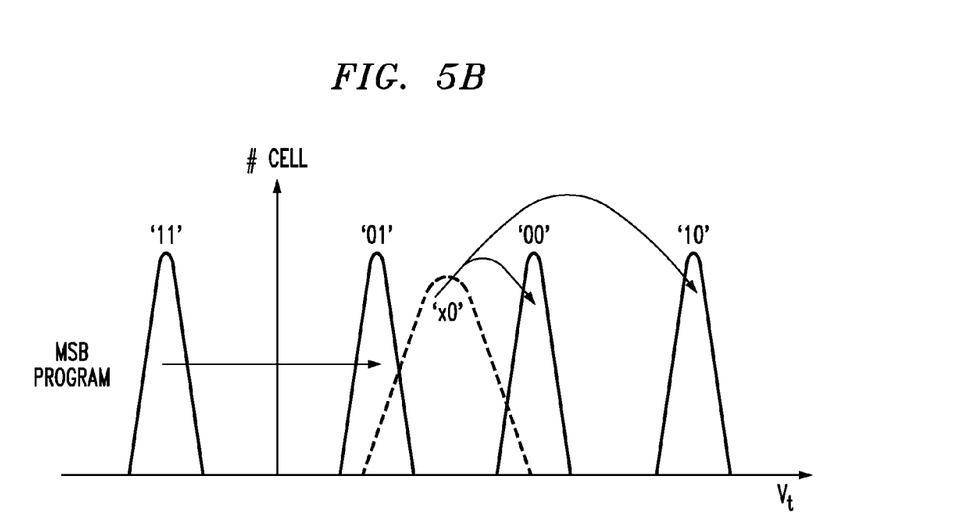

FIGS. 5A and 5B, collectively, illustrate an alternative MLC programming scheme 500 that reduces the ICI inflicted on neighboring cells. As shown in FIG. 5A, during the LSB programming stage, a memory cell is programmed from a state '11' to a state 'x0' as a temporary (or intermediate) state, in a similar manner to SLC programming. After the neighbor cells in the same wordline are also LSB programmed, the distribution is possibly widened as shown by peak 510 in FIG. 5A, due to ICI. Thereafter, at the MSB programming stage, shown in FIG. 5B, the 'x0' state is programmed to either '00' and '10' as the final state corresponding to the input data or else the '11' state is programmed to the final '01' state. Generally, all memory cells except '11' cells are reprogrammed to their final states at the MSB programming stage from the temporary programmed state for LSB data so that the ICI caused by neighbor cells can be largely reduced. A cell in the final state will not suffer from ICI it experienced while being in the intermediate state since it has been reprogrammed to the final state. A cell in the final state will only suffer from ICI it experienced since being in the final state. As noted above, the multi-step programming sequence of FIGS. 5A and 5B, using intermediate program states, reduces the maximum voltage changes and therefore the ICI caused by these voltage changes. It can been seen in FIG. 5B that the maximum voltage shifts for example during the MSB programming stage are associated with transitions from state '11' to '01' and state 'x0' to state '10' respectively. These voltage shifts are significantly smaller than the maximum voltage shift from state '11' to '01' in FIG. 4.

Figure 6:
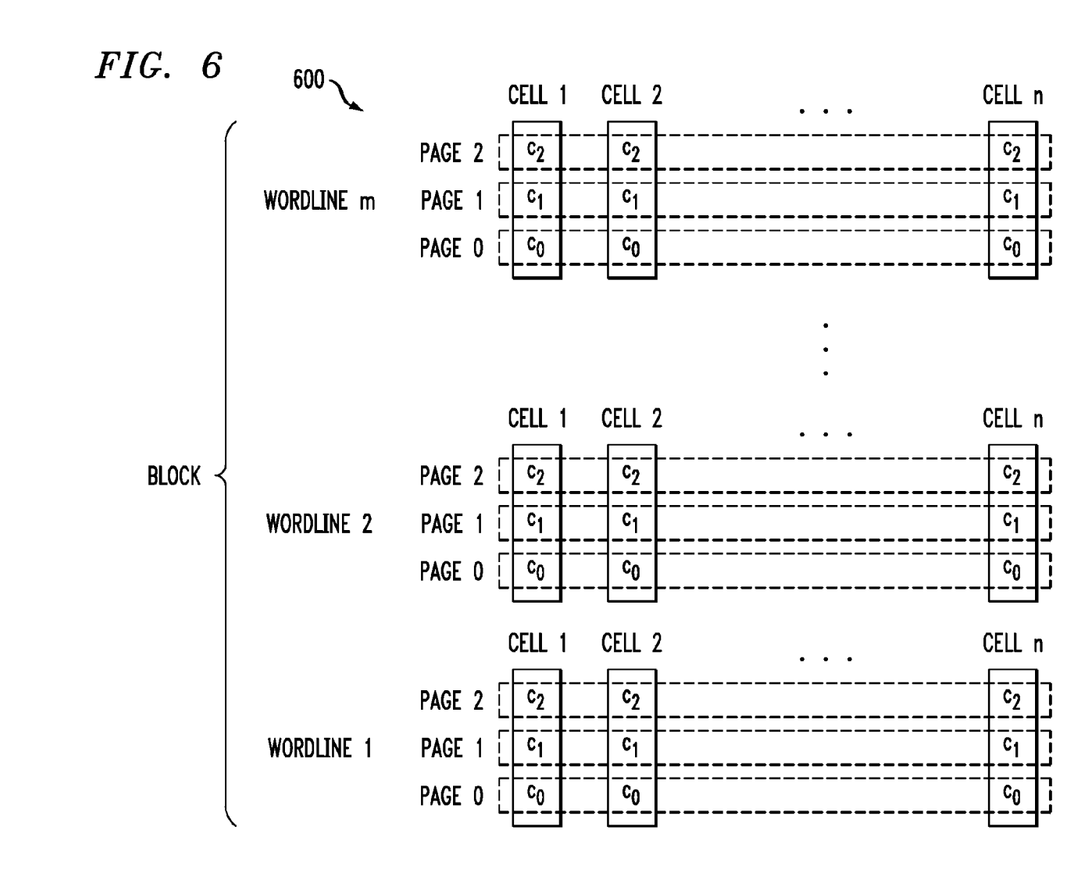
FIG. 6 illustrates an exemplary flash cell array in a multi-level cell (MLC) flash memory device in further detail.

FIG. 6 illustrates an exemplary flash cell array 600 in a multi-level cell (MLC) flash memory device 130 in further detail. As shown in FIG. 6, the flash cell array 600 stores three bits per flash cell, $c_i$. FIG. 6 illustrates the flash cell array architecture for one block, where each exemplary cell typically corresponds to a floating-gate transistor that stores three bits. The exemplary cell array 600 consists of m wordlines and n bitlines. Typically, in current multi-page cell flash memories the bits within a single cell belong to different pages. In the example of FIG. 6, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 6) correspond to even pages, and cells with odd numbers (such as cells 1 and 3 in FIG. 6) correspond to odd pages. In this case, a page (such as page 0) would contain an even page even page 0) in even cells and an odd page (odd page 0) in odd cells.

Intercell Interference

Figure 7:
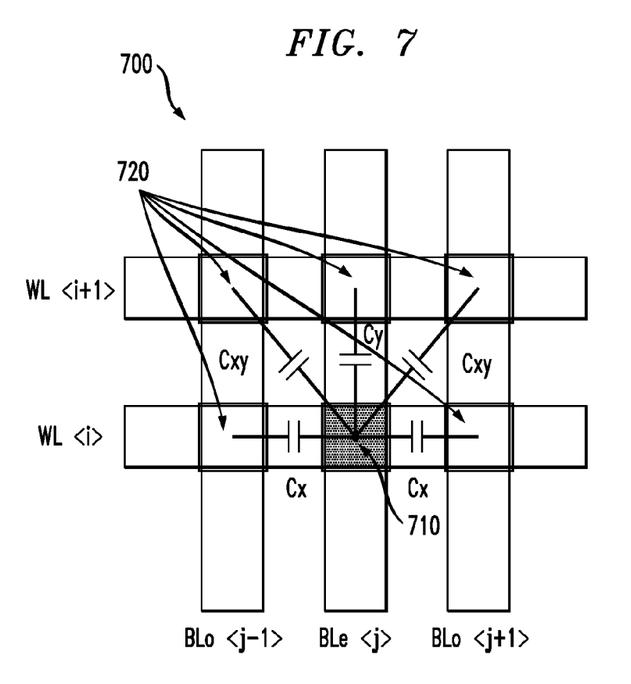
FIG. 7 illustrates the ICI that is present for a target cell due to the parasitic capacitance from a number of exemplary aggressor cells.

As previously indicated, ICI is a consequence of parasitic capacitances between cells and is generally considered to be one of the most prominent sources of distortion. FIG. 7 illustrates the ICI that is present for a target cell 710 due to the parasitic capacitance from a number of exemplary aggressor cells 720. The following notations are employed in FIG. 7:

WL: wordline;
BL: bitline;
BLo: odd bitline;
BLe: even bitline; and
C: capacitance.

The present invention recognizes that ICI is caused by aggressor cells 720 that are programmed after the target cell 710 has been programmed. The ICI changes the voltage, $V_t$, of the target cell 710. In the exemplary embodiment, a "bottom up" programming scheme is assumed and adjacent aggressor cells in wordlines i and i+1 cause ICI for the target cell 710. With such bottom-up programming of a block, ICI from the lower wordline i−1 is removed, and up to five neighboring cells contribute to ICI as aggressor cells 720, as shown in FIG. 7. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells need to be considered. Other cells that are further away from the target cell can be neglected, if their contribution to ICI is negligible. In general, the aggressor cells 720 are identified by analyzing the programming sequence scheme (such as bottom up or even/odd techniques) to identify the aggressor cells 720 that are programmed after a given target cell 710.

The ICI caused by the aggressor cells 720 on the target cell 710 can be to modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of agressor cell (w,b), $\Delta V_{ICI}^{(i,j)}$ is the change in $V_t$ voltage of target cell (i,j) due to ICI and $k_x$, $k_y$ and $k_{xy}$ are capacitive coupling coefficients.

Generally, $V_t$ is the voltage representing the data stored on a cell and obtained during a read operation. $V_t$ can be, for example, a soft voltage value with more precision than the number of bits stored per cell, or a value quantized to a hard voltage level with the same resolution as the number of bits stored per cell (e.g., 3 bits for 3 bits/cell flash).

System Level Considerations

Figure 8:
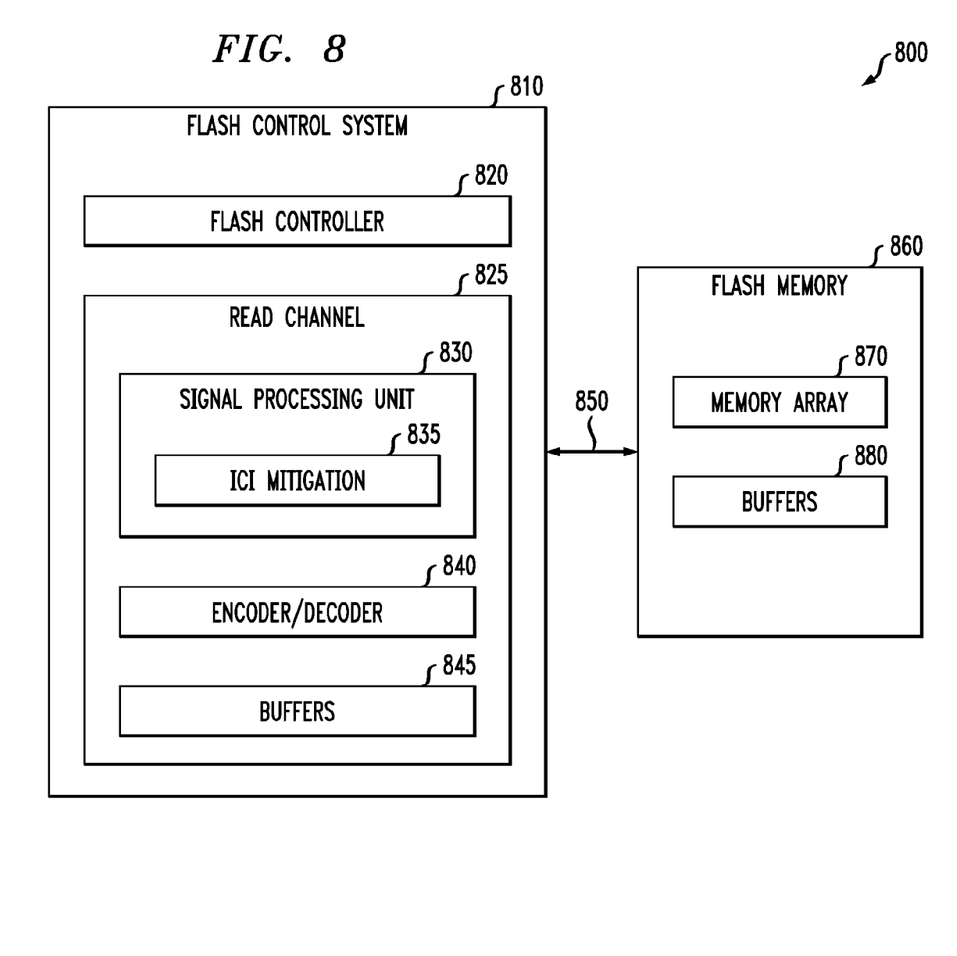
FIG. 8 is a schematic block diagram of an exemplary flash memory system incorporating controller-based ICI mitigation techniques in accordance with the present invention.

FIG. 8 is a schematic block diagram of an exemplary flash memory system 800 incorporating controller-based ICI mitigation techniques in accordance with the present invention. As shown in FIG. 8, the exemplary flash memory system 800 comprises a flash control system 810 and a flash memory block 860, connected by an interface 850. The exemplary flash control system 810 comprises a flash controller 820 and a read channel 825, typically on one or more integrated circuits. The exemplary flash controller 820 may be implemented, for example, using well-known commercially available techniques and/or products, as modified herein to support the features and functions of the present invention.

The exemplary read channel 825 comprises a signal processing unit 830, an encoder/decoder block 840 and one or more buffers 845. It is noted that the term "read channel" can encompass the write channel as well. In an alternative embodiment, the encoder/decoder block 840 and some buffers 845 may be implemented inside the flash controller 820. The encoder/decoder block 840 and buffers 845 may be implemented, for example, using well-known commercially available techniques and/or products, as modified herein to provide the features and functions of the present invention.

The exemplary signal processing unit 830 comprises one or more processors that implement one or more ICI mitigation processes 835, discussed further to below in conjunction with, for example, FIGS. 10-12. In addition, the data flow among the various blocks shown in FIG. 8 is also discussed further below in conjunction with, for example, FIGS. 10-12. Generally, as discussed further below in conjunction with FIGS. 11 and 12, to perform ICI mitigation during a read operation, the one or more ICI mitigation processes 835 compute new read values based on the hard or soft read values. Likewise, as discussed further below in conjunction with FIG. 10, to perform ICI mitigation during a write operation, the one or more ICI mitigation processes 835 generate precompensated program values to be stored in the memory array 870 based on program data for the target and aggressor cells.

The exemplary flash memory block 860 comprises a memory array 870 and one or more buffers 880 that may each be implemented using well-known commercially available techniques and/or products.

According to one aspect of the present invention, discussed further below in conjunction with FIGS. 10 and 11, the exemplary interface 850 may need to convey additional information relative to a conventional flash memory system, such as values representing information associated with aggressor cells. Thus, the interface 850 may need to have a higher capacity (for example more input or output pins) or faster rate than an interface in conventional flash memory systems.

During a write operation, the interface 850 transfers the precompensated program values to be stored in the target cells, typically using page or wordline level access techniques. For a more detailed discussion of exemplary page or wordline level access techniques, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding And Per-Page Coding,", incorporated by reference herein. Typically, more bits are required to represent precompensated program values than to represent original program values since the number of precompensated program values is typically larger than the number of original program values. Therefore, for write-side ICI mitigation, the interface 850 needs to transfer more data than a conventional interface.

During a read operation, the interface 850 transfers hard and/or soft read values that have been obtained from the memory array 870 for target and aggressor cells. For example, in addition to read values for the page with the target cell, read values for to one or more adjacent pages in upper/lower wordlines or neighboring even or odd bit lines are transferred over the interface bus.

In the embodiment of FIG. 8, the disclosed write- or read-side ICI mitigation techniques are implemented outside the flash memory, typically in a process technology optimized for logic circuits to achieve the lowest area. It is at the expense, however, of the additional aggressor cell data that must be transferred on the interface 850.

Figure 9:
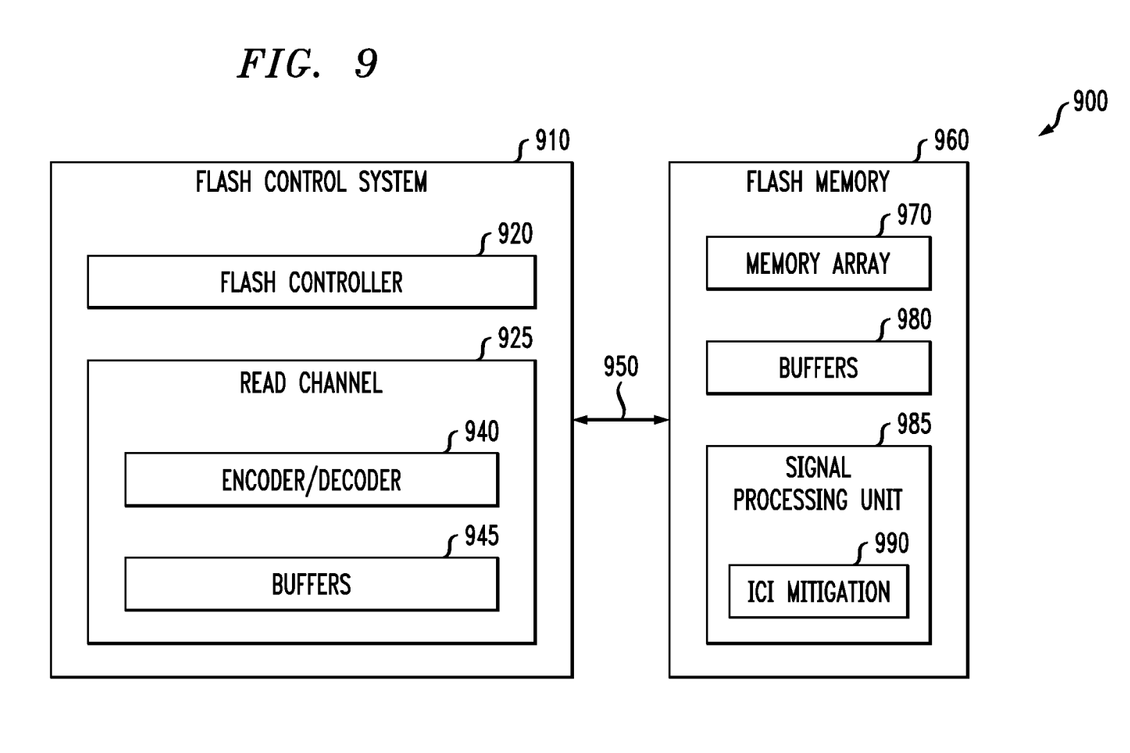
FIG. 9 is a schematic block diagram of an exemplary flash memory system incorporating memory-based ICI mitigation techniques in accordance with an alternate embodiment of the present invention.

FIG. 9 is a schematic block diagram of an exemplary flash memory system 900 incorporating memory-based ICI mitigation techniques in accordance with an alternate embodiment of the present invention. As shown in FIG. 9, the exemplary flash memory system 900 comprises a flash control system 910 and a flash memory block 960, connected by an interface 950. The exemplary flash control system 910 comprises a flash controller 920 and an optional read channel 925, typically on one or more integrated circuits. The exemplary read channel 925 comprises an encoder/decoder block 940 and one or more buffers 945. In an alternative embodiment, the encoder/decoder block 940 and some buffers 945 may be implemented inside the flash controller 920. The exemplary flash controller 920 may be implemented, for example, using well-known commercially available techniques and/or products, as modified herein to support the features and functions of the present invention. The encoder/decoder block 940 and buffers 945 may be implemented using well-known commercially available techniques and/or products.

The exemplary flash memory block 960 comprises a memory array 970 and one or more buffers 980 that may each be implemented using well-known commercially available techniques and/or products. In addition, the exemplary flash memory block 960 comprises an exemplary signal processing unit 985 that comprises one or more processors that implement one or more ICI mitigation processes 990. Generally, to perform ICI mitigation during a read operation, the one or more ICI mitigation processes 990 compute the new read values based on the hard or soft read values read from the memory array 970. Likewise, to perform ICI mitigation during a write operation, the one or more ICI mitigation processes 990 generate precompensated program values based on the program data received from the flash controller 910 for the target and aggressor cells.

According to one aspect of the present invention, discussed further below in conjunction with FIGS. 10 and 11, the exemplary interface 950 may need to convey additional information relative to a conventional flash memory system, such as values representing information associated with aggressor cells. Thus, the interface 950 may need to have a higher capacity (for example more input or output pins) or faster rate than an interface in conventional flash memory systems.

During a write operation, the interface 950 transfers the program data to be stored in the target and aggressor cells, and the precompensated program values are computed inside the flash memory 960. The interface 950 would transfer for example the program data for the page with the target cell as in a conventional flash memory system, and in addition program data for adjacent wordlines or even or odd bit lines with the aggressor cells. Typically, less bits are required to represent this program data than to represent precompensated program values. Therefore, for write-side ICI mitigation, interface 950 would typically require less bandwidth than interface 850. This is however at the expense of implementing the write-side ICI mitigation processes inside the memory using the memory process technology used to manufacture the flash memory, which is typically optimized for memory and not logic circuits.

During a read operation, the interface 950 transfers the new hard or soft read values or data that was computed by the ICI mitigation processes 990 for the target cell(s) and optionally the aggressor cells. Typically, the information conveyed for a single read access is a page or wordline of data. It is noted that only sending data for the target cells reduces the bandwidth requirements of the interface 950, at the expense of implementing the read-side ICI mitigation processes inside the memory using the memory process technology used to manufacture the flash memory, which is typically optimized for memory and not logic circuits.

It is noted that the capacitive coupling coefficients, $k_x$, $k_y$ and $k_{xy}$, employed in the various embodiments of the ICI mitigation techniques of FIGS. 8 and 9 can be computed in the flash control system 810, 910 and/or the flash memory block 860, 960. It may be necessary for the capacitive coupling coefficients, $k_x$, $k_y$ and $k_{xy}$, to be transferred on the respective interface 850, 950. It is noted that the capacitive coupling coefficients may be adaptive and updated on a continuous, occasional or periodic basis.

For a more detailed discussion of exemplary ICI mitigation processes 835, 990, see, for example, PCT Patent Application Serial No. ________, entitled "Methods and Apparatus for Write-Side Intercell Interference Mitigation in Flash Memories," and PCT Patent Application Serial No. ________, entitled "Methods and Apparatus for Read-Side Intercell Interference Mitigation in Flash Memories," each filed contemporaneously herewith and incorporated by reference herein.

Improved Interface 850, 950

As previously indicated, the present invention provides an improved interface 850, 950 between the flash memory controller 820, 920 and the flash memory array 870, 970. According to one aspect of the invention, data for a target cell 710 is transferred on a first edge of a clock signal (such as a rising edge), and additional information about the transferred data is transmitted on a second edge of the clock signal (such as a falling edge). The disclosed interface provides additional bandwidth for additional information about the transmitted data, without significantly increasing power dissipation or surface area.

Generally, the interface 850, 950 may be implemented, for example, in accordance with the ONFI 2.0 standard, incorporated by reference herein, as modified herein to provide the features and functions of the present invention. In this manner, the same interface 850, 950 can be used for legacy flash controllers 820, 920 without the capability to process the soft data and send the additional write data. Legacy flash controllers 820, 920 can ignore the additional data that is transmitted on the falling edge in accordance with the present invention.

As previously indicated, ONFI Version 2.0 uses Double Data Rate (DDR) techniques to transfer data on both the rising and falling edges of the clock signal. While ONFI Version 2.0 has increased the data-carrying capacity of the NAND flash interface, it does not provide additional bandwidth for carrying additional information that may improve performance. In one exemplary embodiment, data for a target cell 710 is transferred on a first edge of a clock signal (such as a rising edge), and additional information about the transferred data, such as soft read data and adjacent write data, is transmitted on a second edge of the clock signal (such as a falling edge).

A. Write Access

Figure 10:
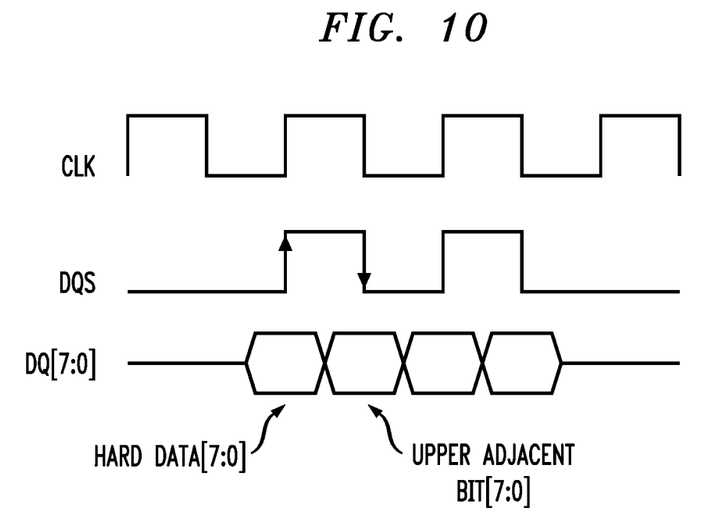
FIG. 10 illustrates the relevant waveforms for a write access in accordance with the present invention.

FIG. 10 illustrates the relevant waveforms for a write access in accordance with the present invention. As shown in FIG. 10, data on a DQ bus of a flash memory is typically clocked using a CLK signal or a DQS (strobe) signal or both. Generally, when the DQS signal is enabled, the DQS signal has a rising edge and a falling edge corresponding to each rising edge and falling edge, respectively, of the CLK signal.

ONFI Version 2.0 transfers data on both the rising and falling edges of the clock signal. The present invention transfers data for a target cell 710 on a first edge of the CLK signal (such as a rising edge), and additional information about the transferred data for the target cell 710 is transmitted on a second edge of the CLK signal (such as a falling edge). In the write access, the increased bandwidth on the falling edge can be used to transfer the additional information (such as aggressor data information) from the flash memory controller 820, 920 to the flash memory array 870, 970, respectively. In one exemplary application, the improved interface 850, 950 provides additional bandwidth to enable the transfer of information for the aggressor cells 720 of a target cell 710 for ICI mitigation. For example, the data latched on the falling edge of the CLK (or DQS) signal can transfer the upper adjacent bit for a target cell 710, which can be used by the ICI mitigation processes 835, 990 to adjust the programmed voltages to mitigate the inter-cell interference.

B. Read Access

Figure 11:
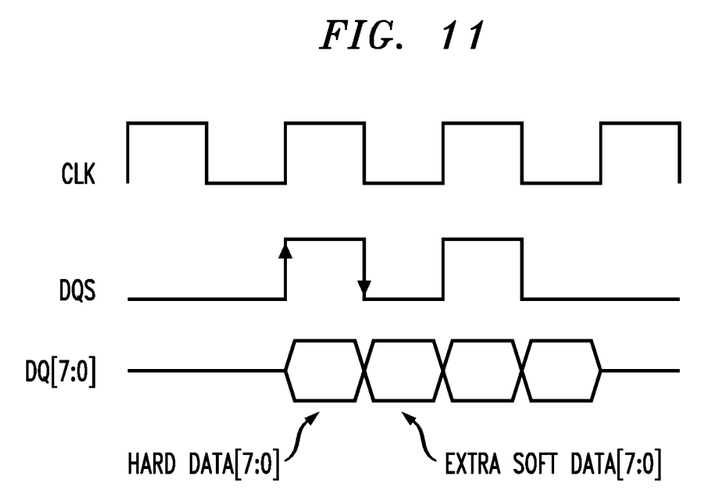
FIG. 11 illustrates the relevant waveforms for a read access in accordance with the present invention.

FIG. 11 illustrates the relevant waveforms for a read access in accordance with the present invention. As shown in FIG. 11, data on a DQ bus of a flash memory is typically clocked using a CLK signal or a DQS (strobe) signal or both. Generally, when the DQS signal is enabled, the DQS signal has a rising edge and a falling edge corresponding to each rising edge and falling edge, respectively, of the CLK signal.

ONFI Version 2.0 transfers data on both the rising and falling edges of the clock signal. The present invention transfers data for a target cell 710 on a first edge of the CLK signal (such as a rising edge), and additional information about the transferred data for the target cell 710 is transmitted on a second edge of the CLK signal (such as a falling edge). In a read access, the increased bandwidth on the falling edge can be used to transfer the soft data (e.g., probability information) for the target cell 710 that is associated with the hard data for the target cell 710 that was transmitted on the rising edge. The transfer is from the flash memory array 870, 970 to the flash memory controller 820, 920, respectively. In one exemplary application, the improved interface 850, 950 provides additional bandwidth to enable the transfer of soft information of a target cell 710 for ICI mitigation. For example, the data latched on the falling edge of the CLK (or DQS) signal can transfer the soft data for a target cell 710, which can be used by the ICI mitigation processes 835, 990 for improved error correction and inter-cell interference mitigation.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A method for interfacing between a flash memory controller and a flash memory array, comprising:
    transmitting data for a target cell in said flash memory array using a first edge of a clock signal; and
    transmitting additional information for said target cell using a second edge of said clock signal, wherein a type of each edge of said clock signal is one of a falling edge type and a rising edge type, wherein said type of said first edge of said clock signal is different than said type of said second edge of said clock signal, and wherein said transmitted additional information comprises a different type of information than said transmitted data.

2. The method of claim 1, wherein said transmitting steps comprise a write access and wherein said transmitted additional information comprises information about one or more aggressor cells associated with said target cell.

3. The method of claim 2, wherein said information about said one or more aggressor cells comprises one or more bits of program data for said one or more aggressor cells.

4. The method of claim 1, wherein said transmitting steps comprise a read access and wherein said transmitted additional information comprises soft information for said data for said target cell transmitted on said first edge.

5. The method of claim 1, wherein said first edge comprises a rising edge and said second edge comprises a falling edge.

6. A method for interfacing between a flash memory controller and a flash memory array, comprising:
    receiving data for a target cell in said flash memory array on a first edge of a clock signal; and
    receiving additional information for said target cell on a second edge of said clock signal, wherein a type of each edge of said clock signal is one of a falling edge type and a rising edge type, wherein said type of said first edge of said clock signal is different than said type of said second edge of said clock signal, and wherein said received additional information comprises a different type of information than said received data.

7. The method of claim 6, wherein said receiving steps comprise a write access and wherein said received additional information comprises information about one or more aggressor cells associated with said target cell.

8. The method of claim 7, wherein said information about said one or more aggressor cells comprises one or more bits of program data for said one or more aggressor cells.

9. The method of claim 6, wherein said receiving steps comprise a read access and wherein said received additional information comprises soft information for said data for said target cell transmitted on said first edge.

10. The method of claim 6, wherein said first edge comprises a rising edge and said second edge comprises a falling edge.

11. An interface for interfacing between a flash memory controller and a flash memory array, comprising:
    a communication channel between said flash memory controller and said flash memory array, wherein said communication channel carries data for a target cell in said flash memory array on a first edge of a clock signal and wherein said communication channel carries additional information for said target cell on a second edge of said clock signal, wherein a type of each edge of said clock signal is one of a failing edge type and a rising edge type, wherein said type of said first edge of said clock signal is different than said type of said second edge of said clock signal, and wherein said additional information comprises a different type of information than said data.

12. The interface of claim 11, wherein for a write access, said additional information comprises information about one or more aggressor cells associated with said target cell.

13. The interface of claim 12, wherein said information about said one or more aggressor cells comprises one or more bits of program data for said one or more aggressor cells.

14. The interface of claim 11, wherein for a read access, said additional information comprises soft information for said data for said target cell transmitted on said first edge.

15. The interface of claim 11, wherein said first edge comprises a rising edge and said second edge comprises a falling edge.

* * * * *